United States Patent
Yasukouchi

(10) Patent No.: US 6,480,069 B2
(45) Date of Patent: Nov. 12, 2002

(54) ACTIVE LOAD CIRCUIT, AND OPERATIONAL AMPLIFIER AND COMPARATOR HAVING THE SAME

(75) Inventor: Katsuyuki Yasukouchi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/796,549

(22) Filed: Mar. 2, 2001

(65) Prior Publication Data

US 2002/0030542 A1 Mar. 14, 2002

(30) Foreign Application Priority Data

Sep. 14, 2000 (JP) ........................................ 2000-279474

(51) Int. Cl.[7] ................................................ H03F 3/04
(52) U.S. Cl. ........................................ 330/288; 330/257
(58) Field of Search ................................ 330/257, 288; 323/325, 316

(56) References Cited

U.S. PATENT DOCUMENTS

| | | | | |
|---|---|---|---|---|
| 4,797,583 A | * | 1/1989 | Ueno et al. | 330/257 |
| 4,887,047 A | * | 12/1989 | Somerville | 330/257 |
| 5,331,290 A | * | 7/1994 | Harford et al. | 330/254 |
| 5,736,892 A | * | 4/1998 | Lee | 330/257 |
| 5,854,574 A | * | 12/1998 | Singer et al. | 330/288 |
| 5,966,050 A | * | 10/1999 | Yoshino et al. | 330/257 |
| 6,252,458 B1 | * | 6/2001 | Shibata | 330/253 |

FOREIGN PATENT DOCUMENTS

JP      A-6-177718      6/1994

* cited by examiner

*Primary Examiner*—Robert Pascal
*Assistant Examiner*—Khanh Van Nguyen
(74) *Attorney, Agent, or Firm*—Arent Fox Kintner Plotkin & Kahn

(57) ABSTRACT

An active load circuit is provided, which is suitable for achieving an operational amplifier circuit, and which may cope with both output current capability and lower consumption current, with less offset, and may be capable of operating at higher speed in case of transient response. The active load circuit is comprised of MOS transistors Tr1 and Tr5 for forming a first current mirror circuit, MOS transistors Tr11 and Tr3 for forming a second current mirror circuit, and resistors R1 and R2. The sources of output transistors Tr5 and Tr11 of respective current mirror circuits are connected to the sources of input transistors Tr3 and Tr1 of the other current mirror circuits and then to the resistors R1 and R2. When the differential current component in the differential input stage becomes larger at the time of transient response of the operational amplifier, the bias current flowing through the next and following stages may be amplified, so that the high speed response characteristics in the transient response of the operational amplifier may be improved.

14 Claims, 6 Drawing Sheets

CIRCUIT DIAGRAM OF AN OPERATIONAL AMPLIFIER USING THE ACTIVE LOAD CIRCUIT IN ACCORDANCE WITH SECOND PREFERRED EMBODIMENT OF THE PRESENT INVENTION

CIRCUIT DIAGRAM OF AN OPERATIONAL AMPLIFIER USING THE ACTIVE LOAD CIRCUIT IN ACCORDANCE WITH THE PRIOR ART

DIAGRAM ILLUSTRATING THE PRINCIPLE OF THE ACTIVE LOAD CIRCUIT IN ACCORDANCE WITH THE PRESENT INVENTION

CIRCUIT DIAGRAM OF AN OPERATIONAL AMPLIFIER USING THE ACTIVE LOAD CIRCUIT IN ACCORDANCE WITH FIRST PREFERRED EMBODIMENT OF THE PRESENT INVENTION

CIRCUIT DIAGRAM OF AN OPERATIONAL AMPLIFIER USING THE ACTIVE LOAD CIRCUIT IN ACCORDANCE WITH SECOND PREFERRED EMBODIMENT OF THE PRESENT INVENTION

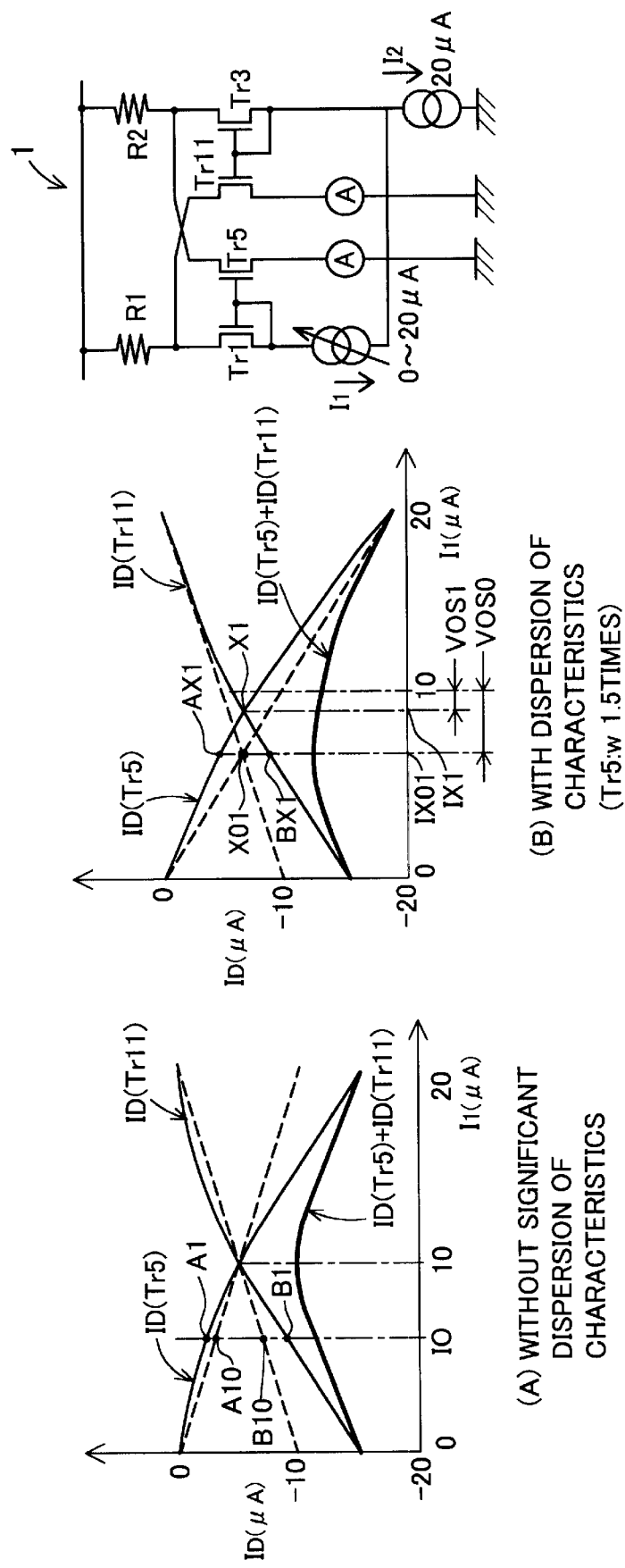
FIG. 5 DIAGRAM ILLUSTRATING THE OPERATION OF THE ACTIVE LOAD CIRCUIT OF THE FIRST EMBODIMENT

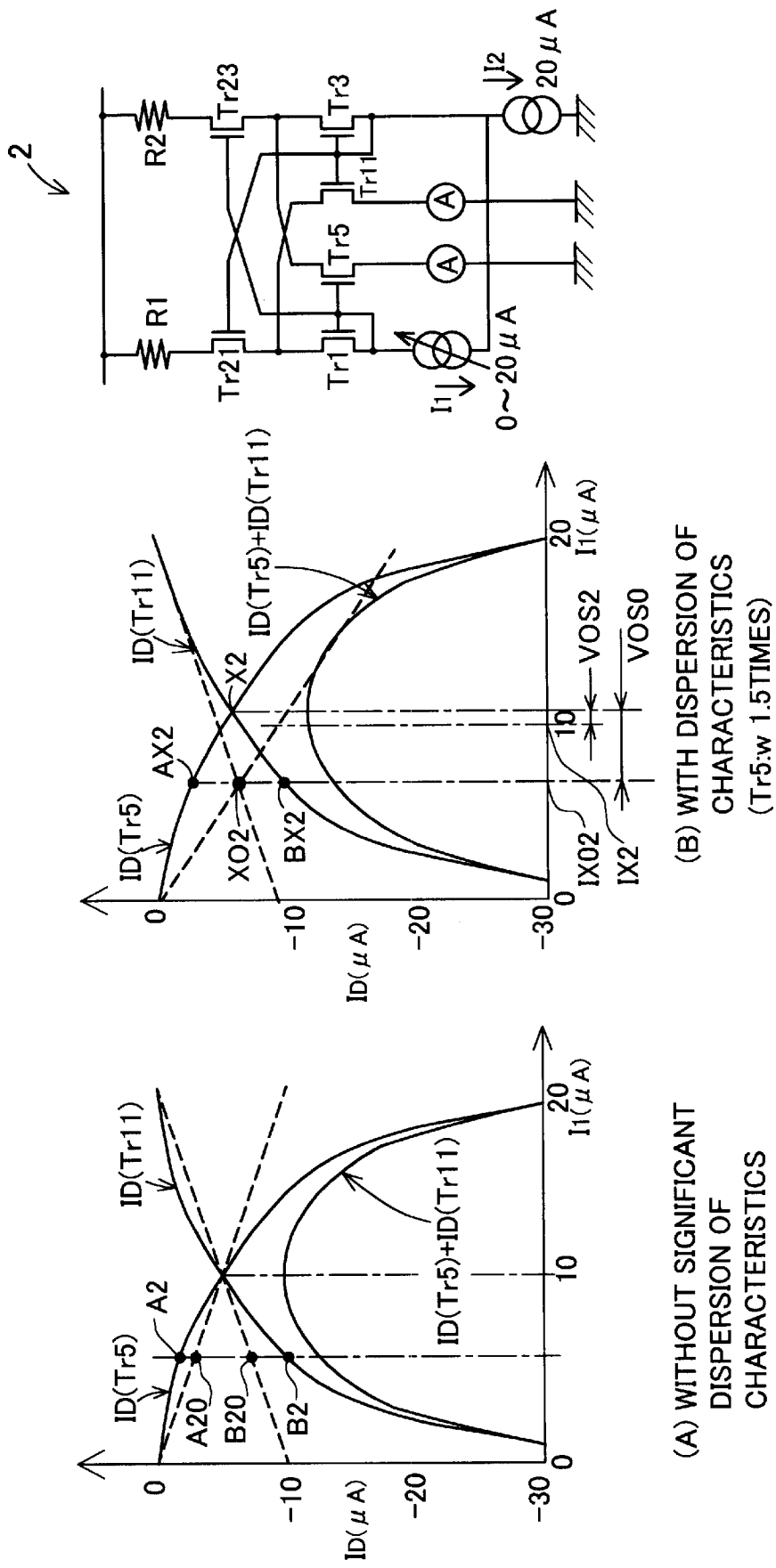
FIG. 6 DIAGRAM ILLUSTRATING THE OPERATION OF THE ACTIVE LOAD CIRCUIT OF THE SECOND EMBODIMENT
(A) WITHOUT SIGNIFICANT DISPERSION OF CHARACTERISTICS
(B) WITH DISPERSION OF CHARACTERISTICS (Tr5:w 1.5TIMES)

ACTIVE LOAD CIRCUIT, AND OPERATIONAL AMPLIFIER AND COMPARATOR HAVING THE SAME

BACKGROUND OF THE INVENTION

1. Field of the Invention

The present invention relates to an active load circuit for use in a differential amplifier and the like, and more particularly to an active load circuit for use in a differential amplifier of the input stage of an operational amplifier.

2. Description of the Related Art

As a measure for reducing the current consumption in the circuitry of operational amplifier while widening the output amplitude thereof into the range of power supply voltage (VDD) to assure the capability of output current, an operational amplifier has been proposed which uses MOS transistors for both source and sink of the output stage. This type of operational amplifier attempts to eliminate the limitation of output amplitude in case that the output transistors are made of bipolar type transistor, require not large bias current, which might be needed when the source or sink of the output stage is made of constant current circuit or bipolar transistors, in order to achieve compatibility in the capability of output current and in the lower consumption current.

FIG. 1 shows an operational amplifier 100 in accordance with the Prior Art. This circuit is an example constituted of MOS transistors. For the differential current flowing through active load transistors Tr101 and Tr103 in the input differential amplifier stage, a current mirror circuit passes the positive input of differential current from the transistor Tr101 to a transistor Tr105, and then from a transistor Tr106 to a transistor Tr108 and another transistor Tr112. The current mirror also passes the negative input of differential current from the transistor Tr103 to a transistor Tr111. Then, the voltage developed from the difference in current between the transistor Tr112 and the transistor Tr111 may be applied to the gate of an output sink transistor Tr114 as well as to the gate of a transistor Tr110 in an output idling current setting circuit, which circuit is formed of transistors Tr107, Tr108, Tr109 and Tr110. In the output idling current setting circuit, transistors Tr107 and Tr109, and transistors Tr108 and Tr110 are of the same types, which may act as a kind of differential circuit. Due to the feedback operation in the system including the operational amplifier 100, in the constant condition, gate voltages of transistors Tr110 and Tr108 may be controlled to be at the same potential and so may drain voltages of the transistors Tr110 and Tr108. The drain of the transistor Tr108, hence the drain of the transistor Tr107 and the drain of the transistor Tr109 may be at the same potential, which potential may be applied to the gate of an output source transistor Tr113.

The gate-source voltage of the output source transistor Tr113 and the transistor Tr109 may become equivalent, so that the current in correspondence with the ratio of gate size of the output source transistor Tr113 to the transistor Tr109 may be drawn as the output stage bias current for compensating for the cross-over distortion in the output stage. The current level of the transistor Tr109 in the output idling current setting circuit may be set by the current ratio of the transistor Tr108 and the transistor Tr110 with respect to the transistor Tr106. By setting this current level to an appropriate value, the bias current flowing through the output stage is suppressed so as to achieve a lower consumption current rate.

However, in the structure of the Prior Art operational amplifier 100, a number of current mirror circuits may be required, because the source/sink transistors tr113 and tr114 in the output stage formed by MOS transistors are biased, by using a current mirror circuit for switching the differential current flowing through the active load transistors Tr101 and Tr103 in the input differential amplifier stage. More specifically, a current mirror circuit such as the transistor Tr101 and the transistor Tr105 for the differential input current in the positive input, the transistor Tr103 and the transistor Tr111 for the differential input current in the negative input, and the transistor Tr106 and the transistor Tr112 for setting bias for the transistor Tr114 for output sink transistor and the like may be required. In such circuits differential pair Tr102 and Tr104 and the active load pair Tr101 and Tr103 in the input differential amplifier stage, as well as the identity of paired transistors may define the accuracy of the operational amplifier 100, therefore the difference in the characteristics between these transistors may cause the dispersion of offset in the operational amplifier 100 to be aggravated. In other words, the dispersion factor may be composed of five sets of circuits in total, including three sets of current mirror circuits plus two sets in the input differential amplifier stage, resulting in a problem that the offset dispersion may be enlarged in the architecture of the operational amplifier 100.

The construction of multi-stage cascading by the current mirror circuits may require a long time for input/output response, resulting in that another problem that the circuitry may not accelerate the response.

SUMMARY OF THE INVENTION

The present invention has been made in view of the above circumstances and to overcome the above problems and has an object to provide an active load circuit, which is suitable for achieving an operational amplifier circuit, which may cope with both output current capability and lower consumption current, with less offset, and may be capable of operating at higher speed in case of transient response.

In order to achieve the foregoing object, the active load circuit in accordance with one aspect of the present invention comprises two current mirror circuits including a first current mirror circuit and a second current mirror circuit, both reference potential connection terminals of the current input transistor in one current mirror circuit and of the current output transistor in another current mirror circuit are paired to route to one end of a first impedance circuit and a second impedance circuit, respectively, then the other end of the first and second impedance circuits are connected to the reference potential.

In the active load circuit as have been described above, when outputting differential output current from the first and second output terminals of the first and second current output transistors in the first and second current mirror circuits in response to the differential input current received at the first and second input terminals of the current input transistors in the first and second current mirror circuits, the differential input current will flow through the first and second impedance circuits, and then the difference in voltage drop in correspondence with the differential component in the differential input current will appear in the first and second impedance circuits, which voltage drop will be applied to the reference voltage connection terminal of the output transistor in the other current mirror circuit.

Only when the differential input current has differential component, the voltage drop in the impedance circuit connected to the circuit having the larger differential component will become larger than the voltage drop in the other impedance circuit, and as the terminal voltage at the reference potential connection terminal of the other output current transistor connected to this impedance circuit will be applied with lower voltage than the terminal voltage of the reference potential connection terminal of the output current transistor of the one impedance circuit, the active load circuit will increase the current driving performance of the output current transistor while decreasing the current driving performance of the output current transistor in the other circuit. Therefore a differential output current amplified to a current rate more than the rate defined by the mirroring ratio in the current mirror circuit may be obtained in correspondence with the magnitude of the differential component in the differential input current. By using this active load circuit as the active load circuit of an operational amplifier circuit, the differential output current may be amplified only when the operational amplifier becomes transient status and consequently the differential input current has the differential component, allowing a high-speed performance of the transient response.

In case in which there is dispersion in the characteristics among the elements of the active load circuit, a certain offset may appear in the differential input current because the differential output current are to be balanced. However, by adding the impedance circuit, the amplifying effect of the differential output current works depending on the differential component in the differential input current. Since differential output current may be far from balancing at the balance point the same to the case without impedance circuit whereby the offset of the differential input current can be narrow, the active load circuit in accordance with the present invention used in the operational amplifier may minimize the dispersion of offset.

In order to achieve the object as have been described above, the operational amplifier in accordance with another aspect of the present invention comprises an active load circuit in the input differential stage including two current mirror circuits made of a first current mirror circuit and a second current mirror circuit, both reference potential connection terminals of the current input transistor in one current mirror circuit and of the current output transistor in another current mirror circuit are paired to route to one end of a first impedance circuit and a second impedance circuit, respectively, then the other end of the first and second impedance circuits are connected to the reference potential.

In the operational amplifier as have been described above, when outputting differential output current from the first and second output terminals of the first and second current output transistors in the first and second current mirror circuits in response to the differential input current received at the first and second input terminals of the current input transistors in the first and second current mirror circuits, the differential input current will flow through the first and second impedance circuits, and then the difference in voltage drop in correspondence with the differential component in the differential input current will appear in the first and second impedance circuits, which voltage drop will be applied to the reference voltage connection terminal of the output transistor in the other current mirror circuit, therefore served as the active load circuit in the input differential stage.

In an operational amplifier having the active load circuit, only when the differential input current has differential component, the voltage drop in the impedance circuit connected to the circuit having the larger differential component will become larger than the voltage drop in the other impedance circuit, and as the terminal voltage at the reference potential connection terminal of the other output current transistor connected to this impedance circuit will be applied with lower voltage than the terminal voltage of the reference potential connection terminal of the output current transistor of the one impedance circuit, the active load circuit will increase the current driving performance of the output current transistor while decreasing the current driving performance of the output current transistor in the other circuit. Therefore a differential output current amplified to a current rate more than the rate defined by the mirroring ratio in the current mirror circuit may be obtained in correspondence with the magnitude of the differential component in the differential input current. Therefore when the operational amplifier is in the transient state, the bias current for the next stage and following may be amplified, allowing a high-speed performance of the transient response.

In addition, the amplification effect of the differential output current in response to the differential component in the differential input current may remedy dispersion in the characteristics among the elements of the active load circuit.

The above and further objects and novel features of the present invention will more fully appear from following detailed description when the same is read in connection with the accompanying drawings. It is to be expressly understood, however, that the drawings are for the purpose of illustration only and not intended as a definition of the limits of the present invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

FIG. 5 is a schematic diagram illustrating the operation of the active load circuit of the first embodiment; and FIG. 6 is a schematic diagram illustrating the operation of the active load circuit of the second embodiment.

DETAILED DESCRIPTION OF THE PREFERRED EMBODIMENTS

A detailed description of first and second preferred embodiments embodying the active load circuit in accordance with present invention will now be given referring to the accompanying drawings.

Figure 2:
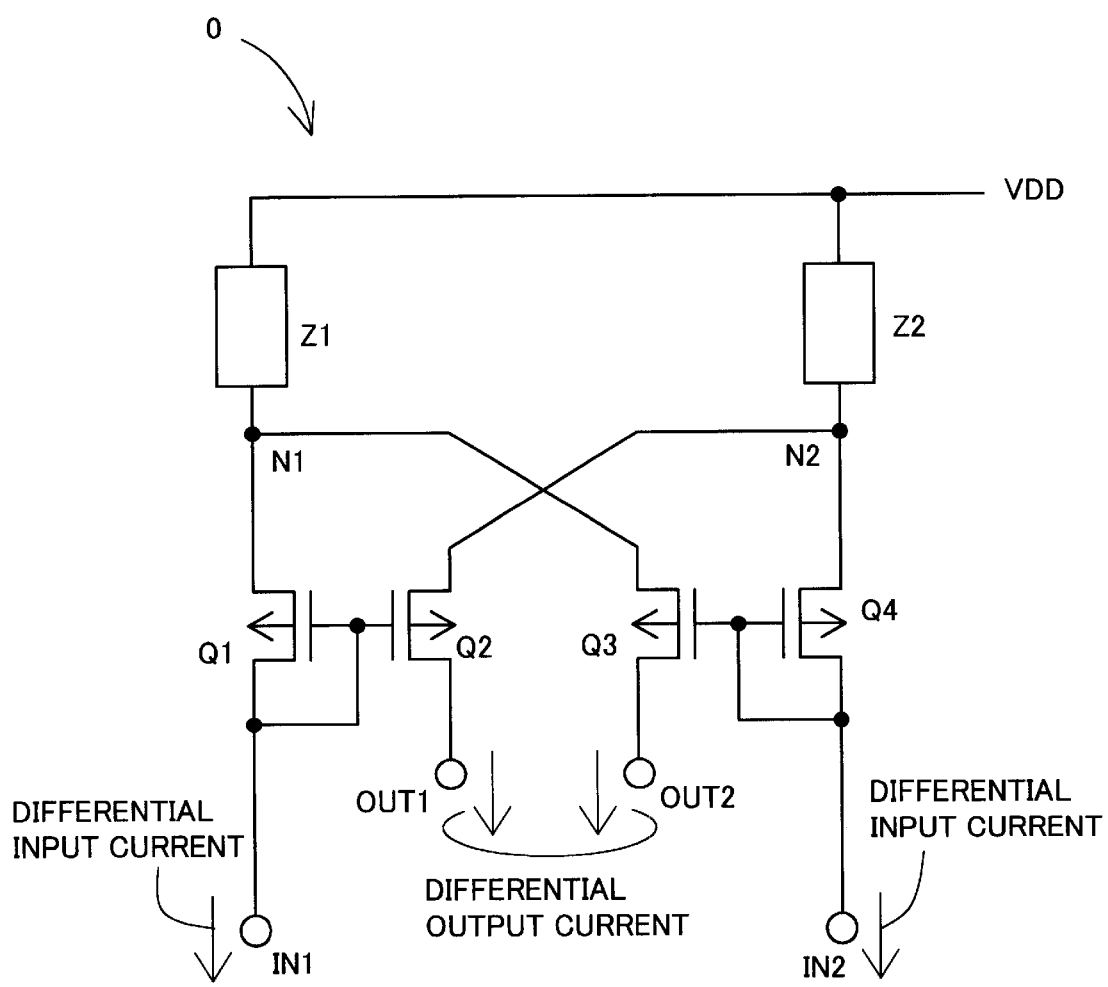
FIG. 2 is a schematic diagram illustrating the principle of the active load circuit in accordance with the present invention.

FIG. 2 shows the principle of the active load circuit in accordance with the present invention, by means of an exemplary circuit using p-type MOS transistors as an element. The active load circuit in accordance with the present invention comprises a first current mirror circuit comprised of p-type MOS transistors Q1 and Q2, and a second current mirror circuit comprised of p-type MOS transistors Q3 and Q4. More specifically, in the active load circuit 0 in accordance with the present invention, the source of input transistor, Q1, in the first current mirror circuit and the source of output transistor, Q3, of the second current mirror circuit are connected to the power supply voltage, VDD, via an impedance circuit Z1. In a similar manner, the sources of input transistor Q4 of the second current mirror circuit and output transistor Q2 of the first current mirror circuit are connected to the power supply voltage VDD via another impedance circuit Z2 in accordance with the present invention. The drain terminals of input transistors Q1 and Q4 of the first and second current mirror circuits are used as differential input terminals IN1 and IN2 for inputting the differential input current. The drain terminals of output transistors Q2 and Q3 of both current mirror circuits are used as differential output terminals OUT1 and OUT2 for outputting the differential output current.

If there is not any differential component in the differential input current input to the differential input terminals IN1 and IN2, no differential component will be appear in the output differential output current, and then both differential output terminals OUT1 and OUT2 will output the in-phase component having the same current value, while at the same time the nodes N1 and N2, which connect the sources of p-type MOS transistors (Q1 and Q3, as well as Q4 and Q2) to the impedance circuits Z1 and Z2, are also at the same potential.

If the differential component in the differential input current is finite, then the differential input current will flow through the impedance circuits Z1 and Z2 to induce a voltage drop, causing a potential difference at the nodes N1 and N2 in relation to the differential component in the differential input current. The difference of electric potential here will modulate the gate-source voltages of the output transistors Q2 and Q3 so as to drive and amplify the differential components in the differential output current. The differential output terminals OUT1 and OUT2 will output the differential output current having differential component amplified in correspondence with the differential component in the differential input current.

Figure 1:
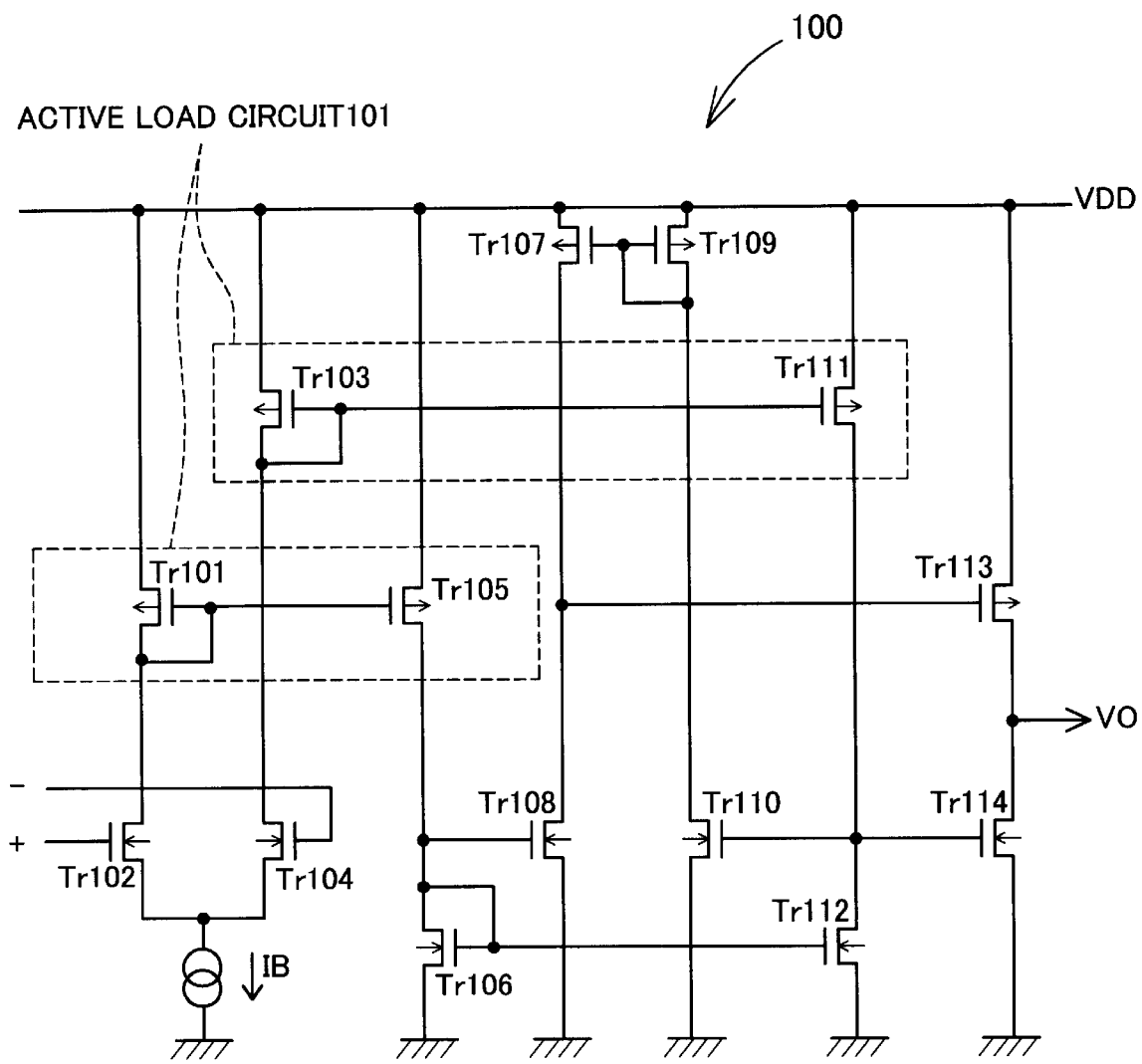
FIG. 1 is a schematic circuit diagram of an operational amplifier using the active load circuit in accordance with the Prior Art.
Figure 3:
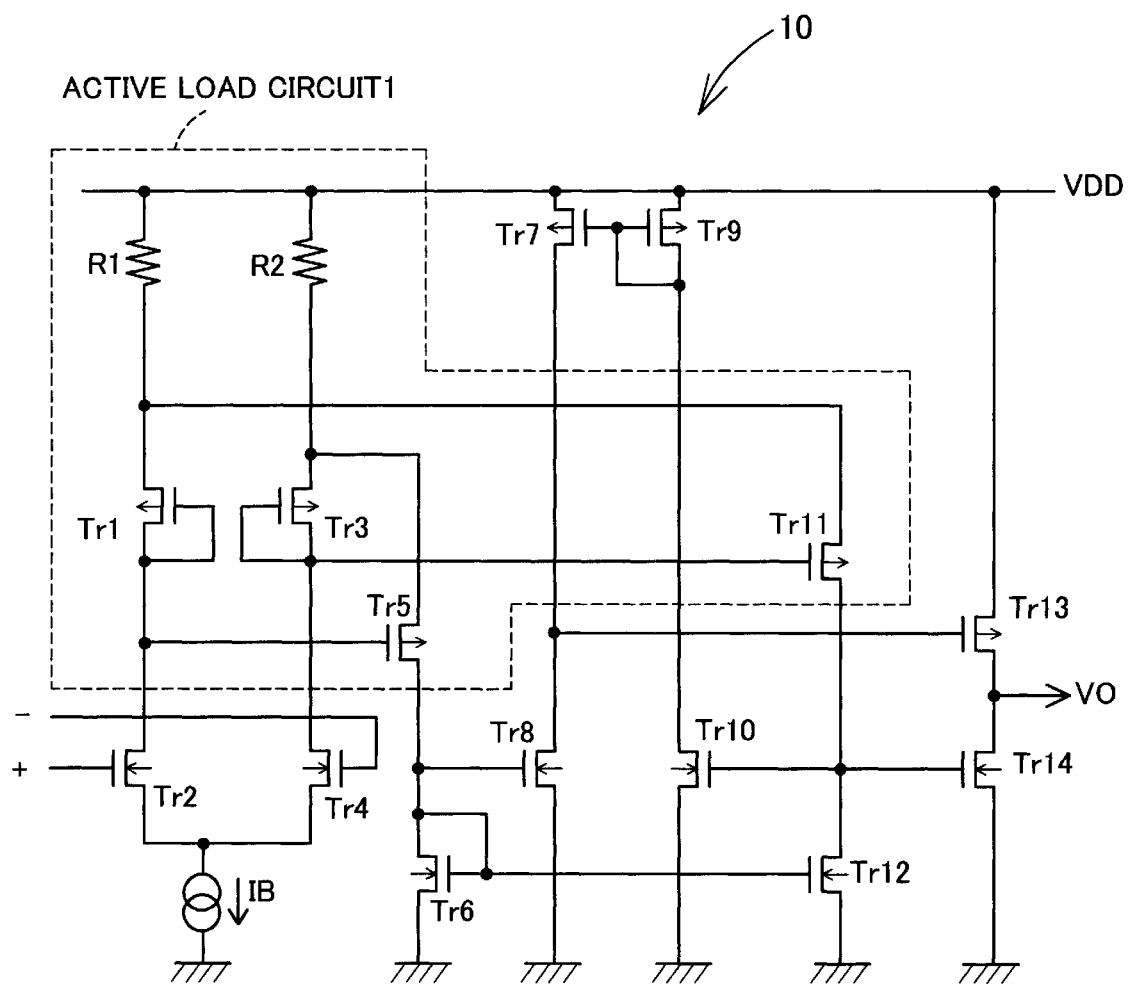
FIG. 3 is a schematic circuit diagram of an operational amplifier using the active load circuit in accordance with first preferred embodiment of the present invention.

The operational amplifier 10 shown in FIG. 3 comprises the active load circuit 1 in accordance with the first preferred embodiment. The active load circuit 1 shown in FIG. 2 has a circuit arrangement with the p-type MOS transistors Q1 to Q4 replaced with p-type MOS transistors Tr1, Tr5, Tr11, and Tr3, and the impedance circuits Z1 and Z2 replaced with resistors R1 and R2. These transistors correspond to the p-type MOS transistors Tr101, Tr105, Tr111 and Tr103 forming the active load circuit 101 in accordance with the Prior Art as shown in FIG. 1, and have the same function as the Prior Art. In the first preferred embodiment, resistors R1 and R2 are added, in addition to the four transistors as above. The source terminals of the output transistors Tr5 and Tr11 in the respective current mirror circuits are connected to the source terminals of the input transistors Tr3 and Tr1 in their corresponding current mirror circuits in the opposite side. When the differential current component in the differential input stage at the time of transient response of the operational amplifier 10 becomes larger, the high speed response characteristics in the transient state response of the operational amplifier 10 may be improved by amplifying the bias current flowing through the next and following stages of the operational amplifier 10.

In addition, the operational amplifier 10 in accordance with the first preferred embodiment has another effect of improving the offset that may be degraded along with the dispersion of characteristics of the elements. This effect will be now described in greater details with reference to FIG. 5.

The schematic circuit diagram shown in FIG. 5 illustrates the active load circuit 1 in accordance with the first preferred embodiment. Here the current input to the transistor Tr1 among the total amount of current I2 of the differential input current is designated to I1. Referring to FIG. 5(A), an input/output characteristics is shown in case of no significant dispersion of characteristics of elements. Referring to FIG. 5(B), another input/output characteristic is shown in case of dispersion of 1.5 times of channel width W of the transistor Tr5 with respect to the output transistor Tr11. In the graphs of input/output characteristics the differential output current of the transistor Tr5 is designated to by ID(Tr5), the differential output current of the transistor Tr11 is designated to by ID(Tr11). The total amount of differential output current is designated to by ID(Tr5)+ID(Tr11). In the figure the input/output characteristics of the active load circuit 101 of the Prior Art without resistors R1 and R2 are shown as dotted line. The current ratio in the current mirror circuits are set to 2:1, the current input ranging from 0 $\mu$A to 20 $\mu$A will produce current output of 0 $\mu$A to 10 $\mu$A.

As shown in FIG. 5(A), if there is no significant dispersion of characteristics among elements, the point at which the differential output currents are equilibrated to disappear the differential component thereof will be I1=10 $\mu$A, where the differential input currents are equilibrated in a manner similar to that of Prior Art to disappear the differential component thereof due to the symmetric configuration of circuitry, the differential output current will be the same. This means that when the active load circuit 1 in accordance with the first preferred embodiment is used for the active load circuit 1 of the operational amplifier 10, the characteristics of low consumption current in the steady state of the operational amplifier 10 may be maintained, in a way identical to the use of active load circuit 101 in accordance with the Prior Art.

When the differential input current, which is offset, from the equilibration point (I1=10 $\mu$A) has differential component, the differential output current will have also some differential component. However the source terminals of output transistors Tr5 and Tr11 of one circuit is connected to the source terminals of input transistors Tr3 and Tr1 of the other and to the power supply VDD through the resistors R1 and R2, the gate-source voltage of the output transistors Tr5 and Tr11 will be modulated so as to amplify the differential output current due to the voltage drop caused by the differential input current passing through the resistors R1 and R2.

A typical example will be described below by way of FIG. 5(A), where I1=I0<10 $\mu$A. In this situation the differential input current (I2−I1) flowing through the transistor Tr3 to the resistor R2 is larger than the differential input current I1 input to the transistor Tr1 of the other circuit, and the voltage drop of the-resistor R2 is larger than that of the resistor R1, so that the gate-source voltage of the transistor Tr5 that flows differential output current smaller than the transistor Tr11 will become smaller as compared with the transistor Tr11, the output current ID(Tr5) will be further smaller than the circuit of the Prior Art without the resistors R1 and R2 (point A1 in FIG. 5(A) in relation to the point A10). At the same time the output current ID(Tr11) from the output transistor Tr11 acts reversely so that the voltage drop caused by the resistor R1 will be smaller than the voltage drop caused by the resistor R2, and the gate-source voltage of the transistor Tr11 will be larger than that of the transistor Tr5, therefore, the output current ID(Tr11) will be further larger than the circuit of the Prior Art without the resistors R1 and R2 (point B1 in FIG. 5(A) in relation to the point B10). The above operation allows the amplification of differential output current, resulting in that high speed response may be obtained at the transient response of the operational amplifier 10 when using the active load circuit 1 in accordance with the first embodiment for the active load circuit of the operational amplifier 10 as compared to the active load circuit 101 of the Prior Art.

When there is dispersion of characteristics among transistors as shown in FIG. 5(B), the point X1, where the differential output currents equilibrate to disappear the differential component, will have an offset due to the deviation of symmetric of the circuits. More specifically, as shown in FIG. 5(B), the circuit in accordance with the Prior Art may equilibrate if I1=IX01<10 $\mu$A, while on the other hand the first preferred embodiment may improve the offset value by the amplification of differential output current. This means that the voltage drop at the resistor R1 flowing I1=IX01<10 $\mu$A can be smaller than the voltage drop across the resistor R2, the gate-source voltage of the transistor Tr11 will be larger than the gate-source voltage of the transistor Tr5, allowing larger current ID(Tr11) to be flown through by the transistor Tr11 (point BX1 of FIG. 5(B)), as well as allowing smaller current ID(Tr5) to be flown through by the transistor Tr5 (point AX1 of the FIG. 5(B)). As a result at the point X1 where the differential output current may equilibrate, since it is required for the transistor Tr5 to flow larger current while for the transistor Tr11 to flow smaller current, the differential input current I1 will be shifted to a larger current I1=IX1 to improve the offset.

In operation in case of transient response, the circuit will operate in a manner similar to the case where there is no dispersion in characteristics. When using the active load circuit 1 in accordance with the first preferred embodiment for the active load circuit of the operational amplifier 10, high-speed response may be obtained at the transient response of the operational amplifier 10, much faster as compared to the use of the active load circuit 101 of the Prior Art.

Although in the above description by referring to FIG. 5, in FIG. 5(A) an example has been presented where I1<10 $\mu$A, and in FIG. 5(B) another example has been presented where I1 region<10 $\mu$A with a wider channel width W of the transistor Tr5, it should be noted that the circuit 1 in accordance with the first preferred embodiment may also perform similar operation due to the symmetric structure of the circuit 1, in the region where I1>10 $\mu$A, as well as in case in which there is a certain dispersion of characteristics different from the example shown.

Therefore, the active load circuit 1 in accordance with the first preferred embodiment, an operational amplifier 10, which may assure the output current capability with the output amplitude widen to the range of power supply voltage VDD while at the same time reducing the current consumption in the circuit, may achieve the bias current amplification restricted to the transient response, in addition to the conventional performance, allowing faster response characteristics in the transient as well as the prevention of the offset performance degradation in the operational amplifier 10, caused by the heterogeneity of characteristics among the elements.

In addition, by forming impedance circuits which may have an effect of amplifying the differential output current with the resistors R1 and R2, which have been habitually used in the conventional active load circuit in general to produce voltage drop in proportion to the differential component of the differential input current, a special area is not needed to be reserved in the design of layout, allowing the layout resources in the past to be effectively used.

Figure 4:
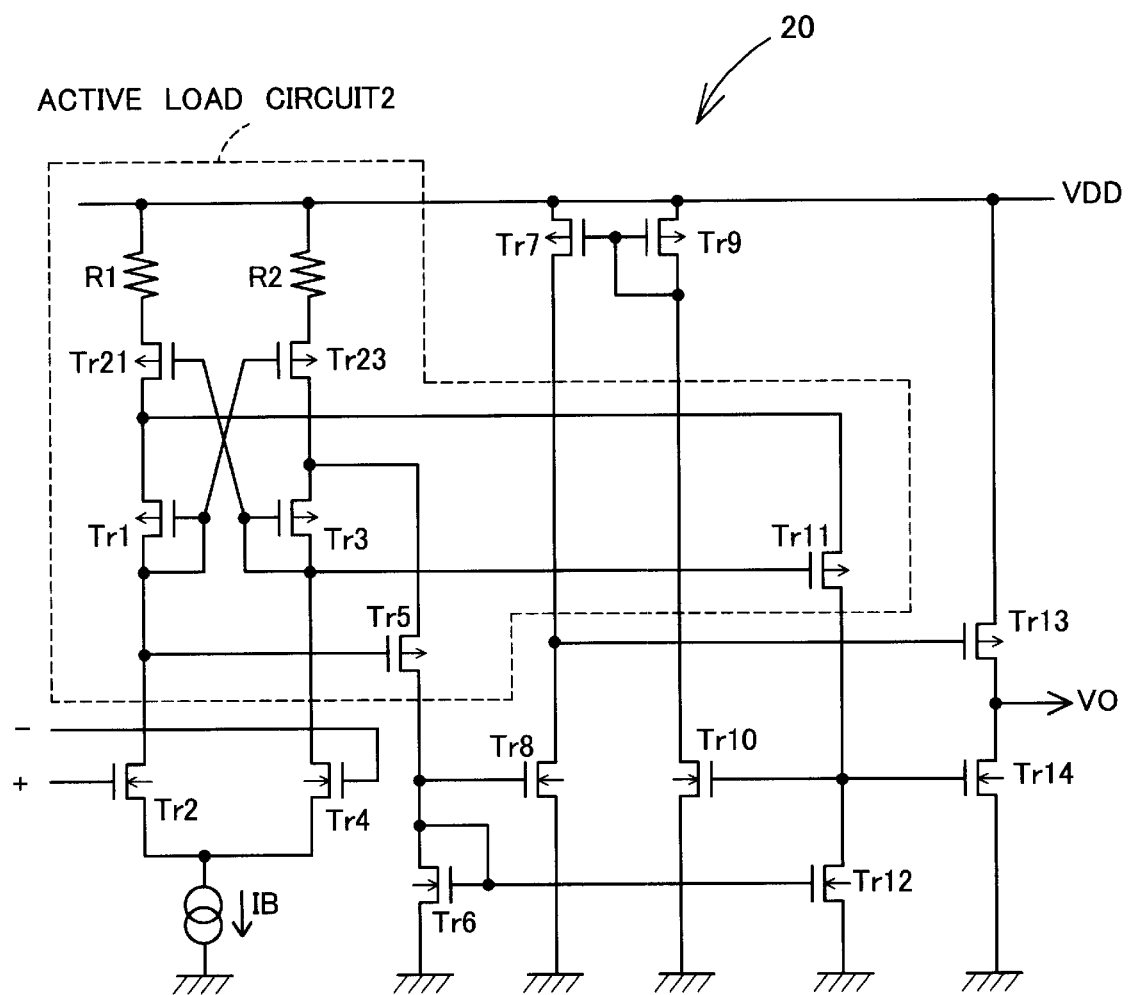
FIG. 4 is a schematic circuit diagram of an operational amplifier using the active load circuit in accordance with second preferred embodiment of the present invention.

Next, an operational amplifier 20 shown in FIG. 4 comprises an active load circuit 2 in accordance with the second preferred embodiment of the present invention. The fundamental configuration of the active load circuit 2 is mostly identical to that of first embodiment, except for p-type MOS transistors Tr21 and Tr23 inserted between the resistors R1 and R2 and p-type MOS transistors Tr1, Tr11, Tr3 and Tr5 of the first preferred embodiment as the active resistors. More specifically, the active load circuit 2 of the operational amplifier 20 may be formed by connecting the source terminal of the MOS transistor Tr21 to the resistor R1, the drain thereof to the source terminals of the MOS transistors Tr1 and Tr11, the gate to the gate and drain of the MOS transistor Tr3, and similarly by connecting the source terminal of the MOS transistor Tr23 to the resistor R2, the drain thereof to the sources of the MOS transistors Tr3 and Tr5, and the gate to the gate and drain of the MOS transistor Tr1.

When applying the active load circuit 2 in accordance with the second preferred embodiment to the operational amplifier 20, as similar to the use of the operational amplifier 10 in accordance with the first preferred embodiment, the high speed response in the transient may be improved by simply amplifying the bias current, while at the same time the offset dispersion degraded along with the dispersion of characteristics among elements may be improved, at the time when the differential current component in the differential input stage at the transient response state of the operational amplifier 20.

FIG. 6 shows a practical example. In the second embodiment, elements of the circuit 2 such as size and type of transistors, resistors, feed of input current, and characteristics of input output are identical to that of the first preferred embodiment as shown in FIG. 5.

When there is no dispersion of characteristics among elements as shown in FIG. 6(A), the point where the differential component disappears by the equilibrated differential output current by the circuit symmetry will be I1=10 $\mu$A, at which the differential output current will also be equalized, in a manner similar to the case in the Prior Art as well as the first preferred embodiment. Thus when the active load circuit 2 in accordance with the second preferred embodiment is used for the operational amplifier 20, the low consumption of current may be maintained at the same level as the active load circuit 101 of the Prior Art and as the active load circuit 1 of the first preferred embodiment, in the steady state.

In case in which the differential input current is offset from the equilibration point and has a certain differential component, as shown more practically by I1=I0<10 $\mu$A in FIG. 5(A), the way similar to the first embodiment as have been described above, may help to shift both the current value ID(Tr5) of the transistor Tr5 to decrease from A20 to A2, and the current value ID(Tr11) of the transistor Tr11 to increase from B20 to B2, respectively, so as to finally amplify the differential output current prior to output.

In case in which there is dispersion of characteristics among transistors as shown in FIG. 6(B), the offset value may be improved similarly. The offset value I1=IX02<10 $\mu$A as shown in FIG. 6(B) may be improved up to I1=IX2.

In the second preferred embodiment, the modulation of the gate-source voltages of the transistors Tr5 and Tr11, which may lead to amplification, is reinforced by the serial connection of the active resistance elements, p-type MOS transistors Tr23 and Tr21, to the resistors R1 and R2 of the first embodiment. More specifically, because the amount of voltage drop increases along with the addition of resistance and the added resistance makes use of the channel resistance of the MOS transistors Tr23 and Tr21 so that the gate terminal can be controlled by the input terminal voltage of the other current mirror circuit, the impedance of the MOS transistors Tr23 and Tr21 will be adjusted so as to, in response to the differential component in the differential input current, either or both increase the impedance of the MOS transistor Tr23 (or Tr21) on the side having relatively larger differential current, and/or decrease the impedance of the MOS transistor Tr21 (or Tr23) on the side having relatively smaller differential current. In other words, since the current mirror circuit has the effect of enhancing the amount of channel resistance in response to the differential component of the differential input current, the larger the differential component is, the larger the difference of resistance may appear, and the amplification rate of the differential output current may thereby be set to a higher level. Furthermore since the current mirror circuit amplifies the differential output current on the basis of the voltage difference between the source terminals of the output transistors Tr5 and Tr11, the current mirror circuit may obtain a still larger effect of amplification.

When using the active load circuit 2 for the active load circuit of the operational amplifier 20, the circuit may substantiate a faster response characteristic at the time of transient response, and may attain an operational amplifier 20, which has a smaller deviation of offset with respect to the dispersion of characteristics of the elements.

In addition, by forming the active elements which may have an effect of amplifying the differential output current with the MOS transistors Tr23 and Tr21, which elements have been habitually used in the conventional active load circuit in general, and by controlling the gate terminals of the MOS transistors by the input terminal voltage of both current mirror circuits, a special area is not needed to be reserved in the design of layout, allowing the layout resources in the past to be effectively used. Similarly, for the gate terminal control signals, existing signals may also be used and no need is present for generating such signals, a simpler and more positive control may be performed.

As similar to the first preferred embodiment as have been described above, in the region where I1>10 μA in FIG. 6, and in case in which there is dispersion in characteristics among other elements, the symmetric circuit design in accordance with the second preferred embodiment of the present invention may also permit to perform the operation identical to the practical description as above.

As a result, in an operational amplifier 20 having the arrangement which may enlarge the amplitude of output up to the range of power supply voltage VDD to assure the output current capability while at the same time minimizing the power consumption in the circuit, the amplification of bias current only at the transient response may be realized in addition to the conventional performance. This may allow a faster response characteristic to be attainable and may prevent the degradation of offset performance of the operational amplifier 20 along with the dispersion in characteristics among elements.

In addition, the active load circuit 1 in accordance with the first preferred embodiment may be constructed by simply adding the resistors R1 and R2, which have been regularly used in the conventional active load circuit in general. Also, the active load circuit 2 in accordance with the second preferred embodiment may also be constructed by simply adding the active resistance elements only, MOS transistors Tr21 and Tr23, which have been habitually used in the conventional active load circuit in general. In both cases any special area is not needed to be reserved in the design of layout, allowing the layout resources in the past to be effectively used. Similarly, for the gate terminal control signals of the MOS transistors Tr21 and Tr23, existing signals may also be used and no need is present for generating such signals, a simpler and more positive control may be performed.

As have been described above in greater details, the active load circuit 1 in accordance with the first preferred embodiment, is comprised of a first current mirror circuit formed by p-type MOS transistors Tr1 and Tr5, and a second current mirror circuit formed by p-type MOS transistors Tr3 and Tr11; the source terminals of transistor Tr1 and transistor Tr11 are connected to resistor R1, and the source terminals of transistor Tr3 and transistor Tr5 are connected to resistor R2. Then the drain terminals of the transistor Tr1 and the transistor Tr3 are used for the differential input terminals, and the drain terminals of the transistor Tr5 and the transistor Tr11 are used for the differential output terminals. Then when this circuit is connected to the operational amplifier 10 as the active load circuit 1, it can amplify the bias current in the next and following stages by the resistors R1 and R2 at the transient response, in addition to the conventional performance of the active load circuit 101 in accordance with the Prior Art as shown in FIG. 1. As a consequence the high-speed response characteristics at the time of transient response of the operational amplifier 10 may be significantly improved.

More particularly, as shown in FIG. 5(A), when there is no significant dispersion in characteristics of elements, because, owing to the transistor Tr11, the gate-source voltage of the transistor Tr5 through which a small fraction of differential output current flows, will become smaller than that of the transistor Tr11, the output current ID(Tr5) will become smaller than the circuit in accordance with the Prior Art without the resistors R1 and R2 (point A1 in FIG. 5(A) with respect to the point A10). Also, the output current ID(Tr11) of the output transistor Tr11 will be larger than the circuit in accordance with the Prior Art without the resistors R1 and R2 (point B1 in FIG. 5(A) with respect to the point B10), because the gate source voltage of the transistor Tr11 will be larger than that of the transistor Tr5. Therefore the differential output current may be amplified so as to accelerate the transient response characteristics of the operational amplifier 10. In case in which there is certain dispersion in characteristics of elements in FIG. 5(B), the transient response characteristics may similarly be improved.

In addition, as shown in FIG. 5(A), at the point where the differential component disappears by the equilibrated differential output current by the circuit symmetry (I1=10 μA), will be I1=10 μA, where there is no differential component because of the differential input current equilibrated by the symmetry of the circuit, at which point the differential output current will also be equalized at the same level. Thus, when using the active load circuit 1 for the active load circuit of the operational amplifier 10, the characteristics of low consumption current in the steady state of the operational amplifier 10 may be maintained, in a way identical to the Prior Art circuit, Furthermore, when there is dispersion in characteristics and the channel width of the transistor Tr5 is 1.5 times that of other transistors, as shown in FIG. 5(B), with respect to I1=IX01<10 μA, which point is the equilibration point X01 in the Prior Art, by the amplification effect of the differential output current, a large current ID(Tr11) will flow by the transistor Tr11 when compared to the current ID(Tr5) flowing through the transistor Tr5 (points AX1 and BX1 in FIG. 5(B)), so that the point X1 where the differential output current equilibrates will be shifted to the direction that the differential input current I1 may further increase, resulting in the improvement of offset.

The characteristics as have been described above may be equally true not only in the region I1<10 µA but also I1>10 µA in FIG. 5(A) and (B), owing to the symmetry of the circuit 1 in accordance with the first embodiment. The circuit acts similarly in characteristics of elements dispersed differently from the example. The active load circuit 1 in accordance with the first embodiment having the arrangement which may permit the operational amplifier 10 to enhance the amplitude of output up to the range of power supply voltage VDD to assure the output current capability while at the same time minimizing the power consumption in the circuit, the amplification of bias current only at the transient response may be realized in addition to the conventional performance. This may allow a faster response characteristic to be attainable and may prevent the degradation of offset performance of the operational amplifier 10 along with the dispersion in characteristics among elements.

Also, the active load circuit 2 in accordance with the second embodiment, is comprised of, in addition to the active load circuit 1 in accordance with the first embodiment, p-type MOS transistors Tr21 and Tr23 acting as active resistance elements between two current mirror circuit and the resistors R1 and R2, with source terminals connected to resistors R1 and R2, the gate terminals connected to the gate and drain terminals of the transistor Tr3 and to the gate and drain terminals of the transistor Tr1.

When there is no dispersion in characteristics of the elements, as shown in FIG. 6(A), the differential component disappears by the equilibrated differential output current by the circuit symmetry at I1=10 µA and the differential output currents are equalized at the same level, By using the active load circuit 2 for the operational amplifier 20, the characteristics of low consumption current in the steady state, may be maintained, in a way identical to the Prior Art circuit 101 and the active load circuit 1 of the first preferred embodiment.

Also, in case in which the differential input current is offset from the equilibration point, the way similar to the first embodiment as have been described above may help to amplify the differential output current.

In addition, in case in which there is dispersion of characteristics among transistors as shown in FIG. 6(B), the offset value may be improved, as similar to the first preferred embodiment, the offset value I1=IX02<10 µA may be improved up to I1=IX2.

Here, the amplification effect is reinforced by the serial connection of the active resistance elements, p-type MOS transistors Tr21 and Tr23, to the resistors R1 and Resistor R2. Since, in addition to the increase of the amount of voltage drop along with the addition of resistance component, the channel resistance of the MOS transistors Tr21 and Tr23 are controlled by the input terminal voltage of the other current mirror circuit, the circuit has the effect that the difference of channel resistance may expand along with the differential component in the differential input current. The larger differential component may result in larger difference of resistance, allowing the amplitude of differential output current to be enlarged.

When using the active load circuit 2 for the active load circuit of the operational amplifier 20, the circuit may substantiate a faster response characteristic at the time of transient response, and may attain an operational amplifier 20, which has a smaller deviation of offset with respect to the dispersion of characteristics of the elements.

It is needless to state that, as similar to the circuit in accordance with the first preferred embodiment, in the region where I1>10 µA in FIG. 6, and in case in which there is dispersion in characteristics among other elements, the symmetric circuit design of the active load circuit 2 in accordance with the second preferred embodiment of the present invention may also permit to perform the operation identical to the practical description as above.

Therefore, in an operational amplifier 20 having the arrangement which may enlarge the amplitude of output up to the range of power supply voltage VDD to assure the output current capability while at the same time minimizing the power consumption in the circuit, the amplification of bias current only at the transient response may be realized, as well as a faster response characteristics may be attainable, and may prevent the degradation of offset performance of the operational amplifier 20 along with the dispersion in characteristics among elements.

In addition, the active load circuits 1 and 2 in accordance with the first and second preferred embodiments, respectively, may be constructed by simply adding the resistors R1 and R2 or MOS transistors Tr21 and Tr23, which have been regularly used in the conventional active load circuit in general. In both cases any special area is not needed to be reserved in the design of layout, allowing the layout resources in the past to be effectively used. Moreover, for the gate terminal control signals of the MOS transistors Tr21 and Tr23, existing signals may also be used and no need is present for generating such signals, a simpler and more positive control may be performed.

The present invention may be embodied in other specific forms without departing from the spirit or essential characteristics thereof.

For instance, although in the present embodiments the current mirror circuits have been described which is constituted of p-type MOS transistors, the active load circuit in accordance with the present invention is not limited thereto. In other embodiments, n-type MOS transistors, NPN bipolar transistors as well as PNP bipolar transistors and the like may be used instead.

Similarly, it is to be understood by those skilled in the art that the impedance circuits are not to be limited to the circuit arrangement herein given in accordance with the present embodiments, and that the circuit may also be formed by junction FETs either instead of MOS transistors, or in addition to solely MOS transistors. More particularly, the circuit may be formed of any arbitrary combination of these elements including resistance elements.

Although in the above description of the first and second preferred embodiments the present invention has been described by way of typical examples when used for the operational amplifiers, it is to be understood that the present invention may be equally used for the comparators and the like. In such a case a high-speed response characteristics that is much faster may be achieved with respect to the differential input.

In accordance with the present invention, when the differential input current has differential component, the current driving performance of the output transistors is controlled so as to amplify the differential output current in response to the differential component. Thus it will be possible to provide an active load circuit, which is suitable for achieving an operational amplifier circuit, which may cope with both output current capability and lower consumption current, with less offset, and may be capable of operating at higher speed in case of transient response.

The foregoing description of the preferred embodiments of the invention has been presented for purposes of illustration and description thereof. It is not intended to be exhaustive or to limit the invention to the precise form disclosed herein above, and a vast variety of changes, modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated, it is intended that the scope of the invention be defined by the claims appended hereto, and their equivalents.

What is claimed is:

1. An active load circuit, comprising:
    first current mirror circuit for inputting input current of the one of differential input current to a first input terminal of current input transistors and for outputting output current of the one of differential output current from a first output terminal of current output transistors;
    second current mirror circuit for inputting input current of the other of differential input current to a second input terminal of current input transistors and for outputting output current of the other of differential output current from a second output terminal of current output transistors;
    first impedance circuit having one end connected to a reference potential connection terminal of the current input transistor in the first current mirror circuit and to the reference potential connection terminal of the current output transistor in the second current mirror circuit, and the other end connected to the reference potential; and
    second impedance circuit having one end connected to the reference potential connection terminal of the current input transistor in the second current mirror circuit and to the reference potential connection terminal of the current output transistor in the first current mirror circuit, and the other end connected to the reference potential,
    wherein the first and second impedance circuits have first and second MOS transistors, respectively, and
    wherein the gate terminal of the first MOS transistor is connected to second input terminal of the second current mirror circuit, and the gate terminal of the second MOS transistor is connected to first input terminal of the first current mirror circuit.

2. An active load circuit set forth in claim 1, wherein the first impedance circuit has a first resistor element, and the second impedance circuit has a second resistor element.

3. An active load circuit set forth in claim 1,
    wherein the first impedance circuit has a first active element, and the second impedance circuit has a second active element, and
    wherein the first and second active elements are impedance controlled such that the impedance of the first active element increases or decreases in response to the increase or decrease of the input current input to the second current mirror circuit, and the impedance of the second active element increases or decreases in response to the increase or decrease of the input current input to the first current mirror circuit.

4. An active load circuit set forth in claim 1, wherein the first and second current mirror circuits are formed of MOS transistors.

5. An active load circuit set forth in claim 1, wherein the first and second current mirror circuits are formed of bipolar transistors.

6. An operational amplifier comprising the active load circuit set forth in claim 1 for the active load circuit in the input differential stage.

7. A comparator comprising the active load circuit set forth in claim 1 for the active load circuit in the input differential stage.

8. An operational amplifier, comprising:
    an active load circuit at the input differential stage, the active load circuit comprising:
        first current mirror circuit for inputting input current of the one of differential input current to a first input terminal of current input transistors and for outputting output current of the one of differential output current from a first output terminal of current output transistors;
        second current mirror circuit for inputting input current of the other of differential input current to a second input terminal of current input transistors and for outputting output current of the other of differential output current from a second output terminal of current output transistors;
        first impedance circuit having one end connected to a reference potential connection terminal of the current input transistor in the first current mirror circuit and to the reference potential connection terminal of the current output transistor in the second current mirror circuit, and the other end connected to the reference potential; and
        second impedance circuit having one end connected to the reference potential connection terminal of the current input transistor in the second current mirror circuit and to the reference potential connection terminal of the current output transistor in the first current mirror circuit, and the other end connected to the reference potential,
        wherein in the active load circuit, the first and second impedance circuits have first and second MOS transistors, respectively, and
        wherein the gate terminal of the first MOS transistor is connected to the second input terminal of the second current mirror circuit, and the gate terminal of the second MOS transistor is connected to the first input terminal of the first current mirror circuit.

9. An operational amplifier set forth in claim 8, wherein in the active load circuit, the first impedance circuit has a first resistor element, the second impedance circuit has a second resistor element.

10. An operational amplifier set forth in claim 8,
    wherein in the active load circuit, the first impedance circuit has a first active element, and the second impedance circuit has a second active element, and
    wherein the first and second active elements are impedance controlled such that the impedance of the first active element increases or decreases in response to the increase or decrease of the input current input to the second current mirror circuit, and the impedance of the second active element increases or decreases in response to the increase or decrease of the input current input to the first current mirror circuit.

11. An operational amplifier set forth in claim 8 wherein in the active load circuit, the first and second current mirror circuits are formed of MOS transistors.

12. An operational amplifier set forth in claim 8, wherein in the active load circuit, the first and second current mirror circuits are formed of bipolar transistors.

13. An active load circuit, comprising:

first current mirror circuit for inputting input current of the one of differential input current to a first input terminal of current input transistors and for outputting output current of the one of differential output current from a first output terminal of current output transistors;

second current mirror circuit for inputting input current of the other of differential input current to a second input terminal of current input transistors and for outputting output current of the other of differential output current from a second output terminal of current output transistors;

first impedance circuit having one end connected to a reference potential connection terminal of the current input transistor in the first current mirror circuit and to the reference potential connection terminal of the current output transistor in the second current mirror circuit, and the other end connected to the reference potential; and second impedance circuit having one end connected to the reference potential connection terminal of the current input transistor in the second current mirror circuit and to the reference potential connection terminal of the current output transistor in the first current mirror circuit, and the other end connected to the reference potential, wherein the first and second impedance circuits have first and second junction FETs, respectively, and wherein the gate terminal of the first junction FET is connected to second input terminal of the second current mirror circuit, and the gate terminal of the second junction FET is connected to first input terminal of the first current mirror circuit.

14. An operational amplifier, comprising:

an active load circuit at the input differential stage, the active load circuit comprising:

first current mirror circuit for inputting input current of the one of differential input current to a first input terminal of current input transistors and for outputting output current of the one of differential output current from a first output terminal of current output transistors;

second current mirror circuit for inputting input current of the other of differential input current to a second input terminal of current input transistors and for outputting output current of the other of differential output current from a second output terminal of current output transistors;

first impedance circuit having one end connected to a reference potential connection terminal of the current input transistor in the first current mirror circuit and to the reference potential connection terminal of the current output transistor in the second current mirror circuit, and the other end connected to the reference potential; and second impedance circuit having one end connected to the reference potential connection terminal of the current input transistor in the second current mirror circuit and to the reference potential connection terminal of the current output transistor in the first current mirror circuit, and the other end connected to the reference potential, wherein in the active load circuit, the first and second impedance circuits have first and second junction FETs, respectively, and wherein the gate terminal of the first junction FET is connected to the second input terminal of the second current mirror circuit, and the gate terminal of the second junction FET is connected to the first input terminal of the first current mirror circuit.

* * * * *